(12) United States Patent
Singh et al.

(10) Patent No.: US 9,410,990 B2
(45) Date of Patent: Aug. 9, 2016

(54) METHOD AND SENSOR FOR SENSING CURRENT IN A CONDUCTOR

(71) Applicant: Deere & Company, Moline, IL (US)

(72) Inventors: Brij N. Singh, West Fargo, ND (US); Aron Fisk, Fargo, ND (US); Neal D. Clements, Fargo, ND (US); Andrew D. Wieland, Fargo, ND (US)

(73) Assignee: Deere & Company, Moline (IL)

( * ) Notice: Subject to any disclaimer, the term of this patent is extended or adjusted under 35 U.S.C. 154(b) by 259 days.

(21) Appl. No.: 13/790,835

(22) Filed: Mar. 8, 2013

(65) Prior Publication Data

US 2014/0253108 A1     Sep. 11, 2014

(51) Int. Cl.
| | |
|---|---|
| *G01N 27/72* | (2006.01) |
| *G01R 15/18* | (2006.01) |
| *G01R 19/00* | (2006.01) |
| *G01R 31/42* | (2006.01) |

(52) U.S. Cl.
CPC .......... *G01R 15/181* (2013.01); *G01R 19/0007* (2013.01); *G01R 31/42* (2013.01)

(58) Field of Classification Search
CPC . G01N 27/82; G01N 27/9046; G01R 33/1223
USPC .......................................... 324/227, 228, 226
See application file for complete search history.

(56) References Cited

U.S. PATENT DOCUMENTS

| | | | | |
|---|---|---|---|---|
| 3,394,288 A | | 7/1968 | Dadok | |
| 4,710,667 A | * | 12/1987 | Whiteley | ...................... 310/268 |
| 5,489,821 A | * | 2/1996 | Crockett | ...................... 315/151 |
| 5,512,821 A | * | 4/1996 | Ando | ..................... G01N 27/82 |
| | | | | 324/225 |
| 5,586,064 A | * | 12/1996 | Grupp | ........................... 702/190 |
| 5,615,075 A | | 3/1997 | Kim | |

(Continued)

FOREIGN PATENT DOCUMENTS

| | | |
|---|---|---|
| DE | 10233279 A1 | 2/2004 |
| JP | 2004056924 | 2/2004 |

(Continued)

OTHER PUBLICATIONS

John Deere, John Deere Inverter, photographs of production unit (4 pages), date unknown but believed to be commercially available before invention of present invention.

(Continued)

*Primary Examiner* — Tung X Nguyen
*Assistant Examiner* — Dominic Hawkins
(74) *Attorney, Agent, or Firm* — Harness, Dickey & Pierce

(57) ABSTRACT

A sensor comprises an inductor for sensing an alternating current signal component of an observed signal. The inductor comprises a substrate, conductive traces associated with different layers of the substrate, and one or more conductive vias for interconnecting the plurality of conductive traces. A magnetic field sensor senses a direct current signal component of the observed signal. A first filtering circuit has a high-pass filter response. The first filtering circuit is coupled to the inductor to provide a filtered alternating current signal component. A second filtering circuit has a low-pass filter response. The second filtering circuit coupled to the magnetic field sensor to provide a filtered direct current signal component. A sensor fusion circuit determines an aggregate sensed current based on the filtered alternating current signal component and the filtered direct current signal component.

22 Claims, 12 Drawing Sheets

(56) References Cited

U.S. PATENT DOCUMENTS

| | | | |
|---|---|---|---|
| 5,796,224 | A | 8/1998 | Hayashi et al. |
| 5,814,909 | A * | 9/1998 | Yamada et al. .................. 310/64 |
| 6,280,206 | B1 | 8/2001 | Kuroda et al. |
| 6,426,617 | B1 | 7/2002 | Haensgen et al. |
| 6,564,084 | B2 | 5/2003 | Allred, III et al. |
| 6,781,359 | B2 * | 8/2004 | Stauth .................. G01R 15/202 324/117 H |
| 6,879,145 | B1 * | 4/2005 | Harris ...................... G01D 3/08 324/117 H |
| 6,984,975 | B2 * | 1/2006 | Aruga .................... G01D 5/204 324/207.17 |
| 7,218,095 | B2 | 5/2007 | Hill |
| 7,274,186 | B2 | 9/2007 | Yakymyshyn et al. |
| 7,714,594 | B2 | 5/2010 | Ibuki et al. |
| 8,258,777 | B2 | 9/2012 | Chen |
| 2003/0151404 | A1* | 8/2003 | Lescourret .................... 324/228 |
| 2003/0164765 | A1* | 9/2003 | Sumi et al. .................... 340/551 |
| 2005/0242804 | A1* | 11/2005 | Hintz et al. .................... 324/244 |
| 2008/0122408 | A1* | 5/2008 | Keiter et al. ..................... 322/28 |
| 2009/0003510 | A1* | 1/2009 | Vial .......................... G01D 4/04 377/19 |
| 2009/0255727 | A1 | 10/2009 | Tarchinski |
| 2011/0163598 | A1* | 7/2011 | Mahrla ............................ 307/24 |
| 2011/0202235 | A1* | 8/2011 | Oikawa ........................... 701/36 |
| 2012/0112868 | A1* | 5/2012 | Wu et al. ....................... 336/200 |
| 2012/0274436 | A1* | 11/2012 | Li .......................... H01F 21/08 336/200 |

FOREIGN PATENT DOCUMENTS

| | | |
|---|---|---|
| KR | 20060114642 | 11/2006 |
| KR | 20110001753 U | 2/2011 |
| WO | 2010082115 A1 | 7/2010 |

OTHER PUBLICATIONS

Rinehart Motion Systems, inverter unit, photographs of production unit (2 pages), date unknown but believed to be commercially available before invention of present invention.

Semikron, inverter unit, photographs of production unit (2 pages), date unknown but believed to be commercially available before invention of present invention.

Hoka: A new isolated current measuring principle and its feature. 0-7803-5589-X/99/$10.00 0 1999, IEEE.

An alternative low-cost current sensing scheme for high current power electronics circuits. IEEE, Transactions on Industrial Electronics, vol. 42, No. 1, Feb. 1995, pp. 78-84.

International Search Report and the Written Opinion of the International Searching Authority, dated Apr. 23, 2014 (10 pages).

International Search Report and the Written Opinion of the International Searching Authority, dated Apr. 29, 2014 (11 pages).

* cited by examiner

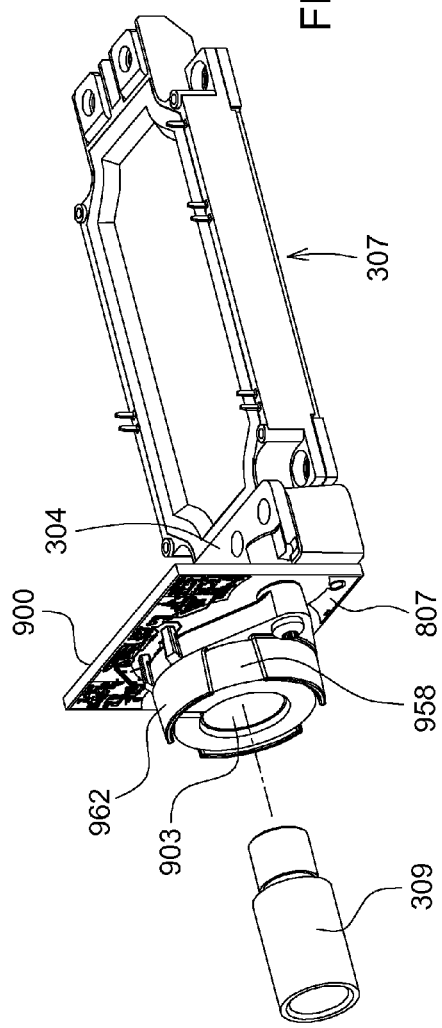
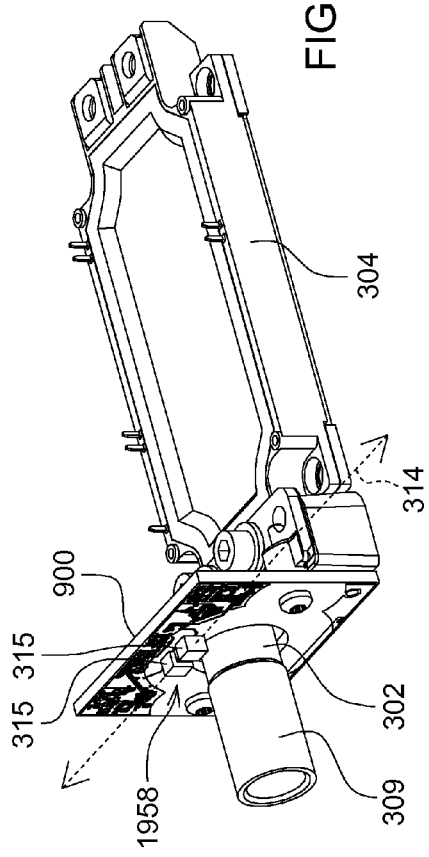

US 9,410,990 B2

METHOD AND SENSOR FOR SENSING CURRENT IN A CONDUCTOR

FIELD OF THE DISCLOSURE

This disclosure relates to a method and sensor for sensing current in a conductor.

BACKGROUND

Vehicles, equipment or machinery may use electric motors that are controlled by inverters or motor controllers. A prior art sensor may measure current in one or more input conductors, such as wires or cables, that feed an electric motor from the inverter. More generally, a prior art sensor may measure current in one or more conductors associated with any power electronics device that uses power semiconductors, such as insulated gate, bipolar transistors (IGBT) or metal-oxide semiconductor field-effect transistors (MOSFET).

Certain prior art sensors for sensing current in a conductor associated with an electric motor may fail prematurely because they have poor resistance to thermal stress. In some prior art sensors, self-heating of a ferromagnetic core, from induced eddy currents and hysteresis losses, can promote failure of a thermally sensitive device, such as Hall effect magnetic field sensor embedded within core, or an inductive coil used with the core. Other prior art sensors for sensing current in the conductor may occupy a larger than desired volume because the maximum circuit density can be limited, while effectively addressing thermal stress. Still other prior art sensors may not respond appropriately for rapid changes in current; hence, fail to respond for a sudden short circuit at an inverter output. Thus, there is a need for a compact sensor for sensing current that is resistant to failures or reduced longevity associated with thermal stresses or associated with inaccurate sensing of rapid changes in current.

SUMMARY

In accordance with one embodiment, a sensor comprises an inductor for sensing an alternating current signal component of an observed signal. The inductor comprises a substrate, conductive traces associated with different layers of the substrate, and one or more conductive vias for interconnecting the plurality of conductive traces. A magnetic field sensor senses at least a direct current signal component of the observed signal. A first filtering circuit has a high-pass filter response. The first filtering circuit is coupled to the inductor to provide a filtered alternating current signal component (e.g., higher frequency component). A second filtering circuit has a low-pass filter response. The second filtering circuit is coupled to the magnetic field sensor to provide at least a filtered direct current signal component (e.g., or a lower frequency component and a direct current component, where the lower frequency component is lower than a higher frequency component). A sensor fusion circuit determines an aggregate sensed current based on the filtered alternating current signal component and the filtered direct current signal component.

BRIEF DESCRIPTION OF THE DRAWINGS

FIG. 11 through FIG. 13, inclusive, show perspective views of one embodiment of the current sensor incorporated into an electric assembly that forms part of an inverter or motor controller.

FIG. 14 shows a perspective view of another embodiment of the current sensor incorporated into an electric assembly.

DESCRIPTION OF ILLUSTRATIVE EMBODIMENT(S)

Figure 1:
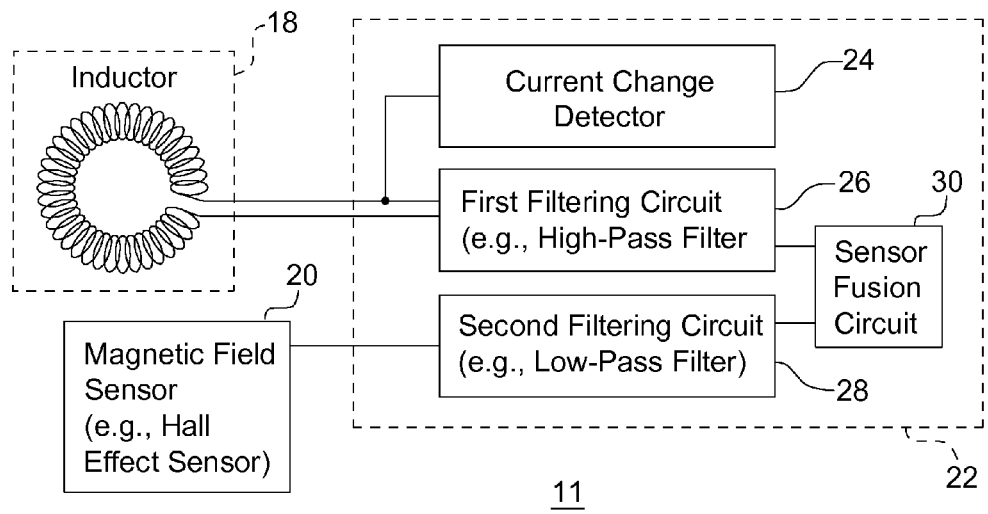
FIG. 1 is a block diagram of a first embodiment of the current sensor for sensing current in a conductor.

In accordance with one embodiment, FIG. 1 illustrates a current sensor 11. As illustrated, the current sensor 11 comprises an inductor 18 for sensing an alternating current signal component (or first alternating signal component) of an observed signal in a conductor 16 (e.g., 16 in FIG. 3). In general, the conductor 16 may comprise a conductor 16 between a source and electrical load. For example, the conductor 16 may comprise a conductor 16 (e.g., wire, cable or bus bar) between an output terminal of an inverter 10 or controller and an input terminal of an electric motor 14.

Alternatively, the conductor 16 could be any conductor, conductive trace, wire, a set of wires, a wire bond or set of wire bonds associated with one or more respective output terminals of corresponding power semiconductor devices (e.g., an insulated-gate, bipolar transistors (IGBT's) or a metal-oxide semiconductor field-effect transistors (MOSFET's)), where the current sensor 11 is configured to sense current flowing within a power electronics module, an electric machine controller, a power output stage, or an inverter (e.g., an inverter housing) from the one or more output terminals to an electric motor, electric machine, or other load connected to the output terminal.

The inductor 18 senses or receives an induced alternating current signal from the conductor 16. For example, the inductor senses or receives a first alternating current signal component (e.g., higher frequency alternating signal component) from the conductor. In one embodiment, the inductor 18 comprises a substrate 900 (e.g., FIG. 6-FIG. 9), conductive traces associated with different layers of the substrate, and one or more conductive vias (e.g., buried vias) for interconnecting the plurality of conductive traces. As used herein, a buried via is a conductive via that is connected to neither outer layer of the multi-layered substrate or multi-layered circuit board. Instead, a buried via connects only between inner layers, or the conductive traces of inner layers, of the multi-layered substrate or circuit board.

Here, in FIG. 1 magnetic field sensor 20 senses at least a direct current signal component of the observed signal in the conductor 16.

Alternately, the magnetic field sensor 20 senses a direct current signal component and a lower frequency signal component (or second alternating signal component) of the alternating current signal in the conductor 16. The second alternating signal component is lower in frequency than the first alternating signal component.

The current sensor 11 comprises circuitry 22 or low voltage electronics. For example, the circuitry 22 has a first filtering circuit 26 and a second filtering circuit 28 that are coupled to a sensor fusion circuit 30. As illustrated, the circuitry 22 further comprises a current change detector 24 that is capable of receiving an alternating current signal from the inductor 18.

A first filtering circuit 26 has a high-pass filter response. The first filtering circuit 26 is coupled to the inductor 18 to provide a filtered alternating current signal component (e.g., first alternating signal component). A second filtering circuit 28 has a low-pass filter response. The second filtering circuit 28 coupled to the magnetic field sensor 20 to provide: (1) a filtered direct current signal component, (2) a lower frequency alternating signal component (e.g., second alternating signal component), or both.

In one embodiment, a sensor fusion circuit 30 determines an aggregate sensed current based on the filtered alternating current signal component and the filtered direct current signal component. The aggregate sensed current refers to the combined current that includes contributions of the direct current signal components and alternating signal components.

For inverter control applications sensor needs to accurately sense current and provide time varying current to controller. However, the sensed current (e.g., from the inductor 18, the magnetic field sensor 20, or both) could also be converted into root mean squared (RMS) signal for diagnosis using any known or commercially available technique (e.g., an I-squared T algorithm). Under one illustrative model of an I squared T algorithm, the continuous maximum power that a motor can dissipate without exceeding its temperature rating is defined by the following equation: $P_{max} = I_{rms}^2 * R_L T$ where $P_{max}$ is the continuous maximum power that a motor can dissipate without exceeding it temperature rating, $I_{rms}$ is the root mean squared current in the windings of the motor, and T is the elapsed time or time duration. For example, data processor (e.g., 54 in FIG. 2) may be programmed to active or deactivate a switch to turn-off an inverter or electrical energy supply to the load or motor if the continuous maximum power is exceeded for a triggering duration.

In a first illustrative example of an alternate embodiment, the sensor fusion circuit 30 not only produces time-varying current signal but may also determines aggregate sensed current by converting the alternating signal components into root mean squared values, or values derived from root mean squared values, for addition to the direct signal component. In a second illustrative example of an alternate embodiment, the sensor fusion circuit 30 may also determine aggregate sensed current by converting the alternating signal components into root mean squared values, or values derived from root mean squared values, for addition to the direct signal component, where the root mean squared component and the direct signal component are assigned weights or scaling factors.

In one embodiment, the sensor fusion circuit 30 scales a first gain of the filtered alternating signal component and a second gain of the filtered direct current signal component to obtain a conversion factor between actual current of the observed signal flowing through a conductor 16 and the aggregate sensed current.

In one embodiment, a current change detector 24 is coupled to the inductor 18. A current change detector 24 comprises a measurement circuit for determining a change in current versus time for the alternating signal component of the observed signal by inductor 18. The observed signal is related to the current flowing in conductor 16, which induces the observed signal in inductor 18. For example, current change detector 24 may comprise a differentiating circuit. The current change detector 24 may be capable of detecting transient short-circuit conditions, for example.

In one embodiment, the magnetic field sensor 20 comprises a Hall Effect sensor. In one configuration, the magnetic field sensor 20 is associated with a ferrite structure to attenuate stray electromagnetic signals (e.g., alternating current) that might otherwise result in distortions or inaccuracies in the measurement of the direct current component, the low frequency alternating signal component, or both.

In one configuration, the inductor 18 comprises a time-varying flux sensor (TVFS) coil and the magnetic field sensor 20 comprises a Hall Effect sensor. Here, the inductor 18 does not need to use a ferromagnetic core; hence, is not susceptible to thermal heating from eddy currents or induced currents than can arise in a ferromagnetic core. The time-varying flux sensor (TVFS) coil and Hall element sense or detect observed current flowing through the conductor 16 (e.g., conductor 16) that is between a source and load, such as an inverter 10 and an electric motor 14, respectively. The inductor 18 (e.g., TVFS coil) is used for time-varying current or an alternating current signal component, while the magnetic field sensor 20 (e.g., Hall Effect sensor) is used for a direct current (DC) signal component and any lower frequency time-varying current component or any lower frequency alternating current signal component.

The inductor 18 (e.g., TVFS coil) feeds sensed first signal ($v_{TVFS}$) to the first filtering circuit 26, which has a high pass filtering response to attenuate low frequency signals. The magnetic field sensor 20 (e.g., Hall Effect) sensor feeds a second sensed signal ($v_{Hall}$) to the second filtering circuit 28, which has a low pass frequency response to attenuate high frequency signals. The respective cut-off frequencies and frequency responses of the first filtering circuit 26 and the second filtering circuit 28 are critical for the performance of the current sensor 11. In one illustrative example, the aggregate frequency response of the first filtering circuit 26 and the second filtering circuit 28 is designed to ensure that the combined or aggregate frequency response of the current sensor has a constant gain from approximately 0 Hz to a frequency at or beyond 1 kHz (approximately) and doesn't offer any material phase shift between any of two input signals (e.g., first sensed signal and second sensed signal, or $v_{TVFS}$ and $v_{Hall}$) and the output signal ($i_{sensed}$) at the output of the sensor fusion circuit 30. Advantageously, the cut-off frequencies of first filtering circuit 26 and the second filtering circuit 28 can be selectively altered (e.g., via selection of capacitances or resistances (e.g., illustrated in FIG. 5) for any tuned circuits) for the current sensor (11 in FIG. 1 or 111 in FIG. 2) to support a wide variety of inverter driven electric machines (e.g., electric motors or generators), such as sinusoidal and non-sinusoidal electric drives as over a considerable range of input operating frequencies and waveforms.

The sensor fusion circuit 30 cooperates with the first filtering circuit 26 and the second filtering circuit 28 to avoid any material phase shift between the two signals, filtered first signal and the filtered second signal, that are inputted to the sensor fusion circuit 30 from the first filtering circuit 26 and the second filtering circuit 28, respectively. The sensor fusion circuit 30 can adjust the gain of magnitude of the filtered first signal provided by the first filtering circuit 26 and the filtered second signal provided by the second filtering circuit 28 to scale the relative contributions of the filtered first signal and the filtered second signal to the output signal ($i_{sensed}$). The sensor fusion circuit 30 combines the filtered first signal and the filtered second signal, which can be outputs of high-pass circuit for TVFS coil and low-pass circuit for Hall Effect sensor. The sensor fusion circuit 30 adjusts the gain of the filtered first signal and the filtered second signal to scale properly the relative contributions of the first signal and second signal to get a conversion factor between current flowing through bus bar and output signal, $i_{sensed}$. Therefore, sensor output ($i_{sensed}$) is a voltage signal with a conversion factor expressed as milli-Volts per Ampere (mV/A).

In one embodiment, the current change detector 24 provides measurement for change in current versus time (di/dt) rating of current flowing through the conductor 16 (e.g., bus bar).

Figure 2:
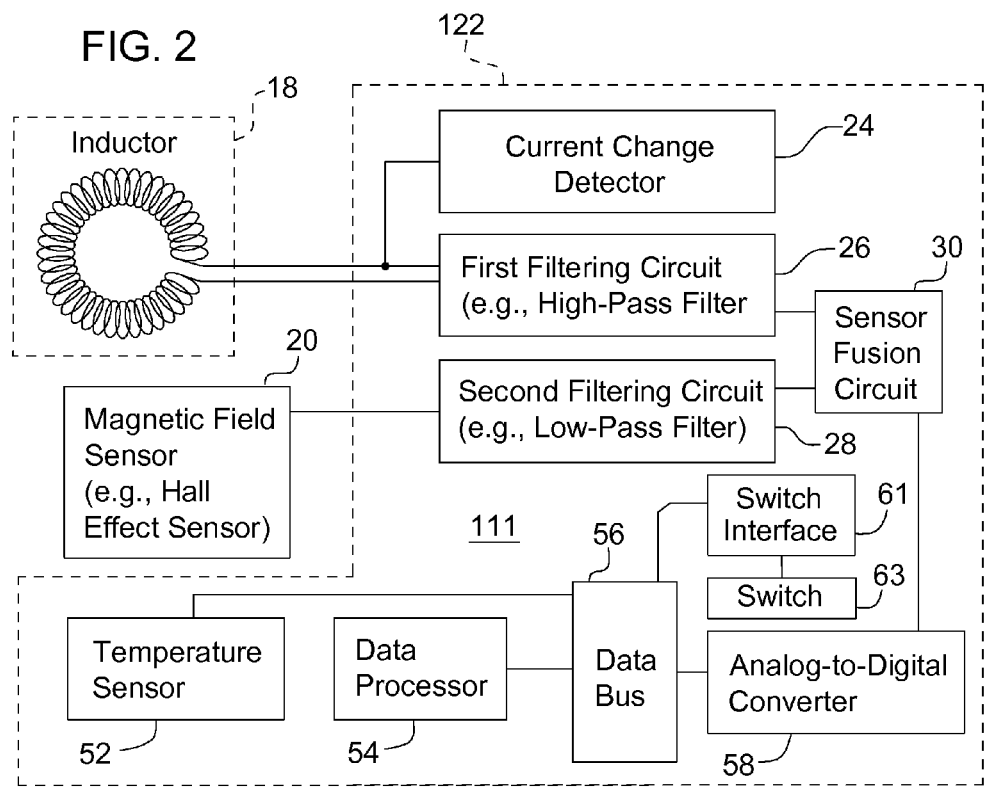
FIG. 2 is a block diagram of a second embodiment of the current sensor for sensing current in a conductor.

The current sensor 111 of FIG. 2 is similar to the current sensor 11 of FIG. 1, except the current sensor of FIG. 2 further comprises a temperature sensor 52, a data processor 54, a data bus 56, an analog-to-digital converter 58. Further the current sensor 111 may comprise an optional switch interface 61 coupled to the data bus, a switch 63 coupled to the switch interface 61, where the switch 61 is a series supply line (e.g., conductor 16) to an inverter or a power supply to an inverter (e.g., 10) or controller. Like reference numbers in FIG. 1 and FIG. 2 indicate like elements.

The current sensor 111 comprises circuitry 122 or low voltage electronics. For example, the circuitry 122 has a first filtering circuit 26 and a second filtering circuit 28 that are coupled to a sensor fusion circuit 30. As illustrated, the circuitry 122 further comprises a current change detector 24 that is capable of receiving an alternating current signal from the inductor 18. In the circuitry 122, a temperature sensor 52, an electronic data processor 54, and an analog-to-digital converter 58 are coupled to a data bus 56.

In FIG. 2, the analog-to-digital converter 58 is coupled to the sensor fusion circuit 30 or the current sensor 111. In turn the analog-to-digital converter 58 is coupled to the data bus 56. The analog-to-digital converter 58 may change the analog aggregate sensed current at the output of the sensor fusion circuit 30 to a digital aggregate sensed current. The data processor 54 can evaluate or process the digital aggregate sensed current to facilitate control, diagnostics, or status of the inverter 10. In certain embodiments, the data processor 54 and data bus 56 may be incorporated into the inverter (e.g., 10).

The temperature sensor 52 and the data processor 54 can communicate via the data bus 56. Similarly, the data processor 54 and the switch interface 61 (e.g., switch driver) can communicate via the data bus 56. The switch interface 61 is coupled to a switch 63 that can interrupt the flow of electrical energy from a power supply to the inverter 10, or otherwise deactivate one or more phases of the inverter.

In one embodiment, the temperature sensor 52 comprises a circuit for estimating a temperature of a conductor 16 or bus bar between the output terminal of an inverter 10 and the input terminal of an electric motor 14. For example, the temperature sensor 52 may comprise a thermistor, an infra-red sensor, or another device that provides an electrical signal or data message that corresponds to a sensed temperature. A thermistor may provide a change in resistance associated with a change in the sensed temperature of the conductor 16.

In one configuration, the temperature sensor 52 provides a digital output. Alternately, if the temperature sensor 52 provides an analog output, an analog-to-digital converter 58 may be used to interface with the data bus 56. The sensed temperature data or message from the temperature sensor 52 is provided to or accessible to the data processor 54. The data processor 54 may use the sensed temperature data to deactivate or turn-off switch 61 power switches (e.g., power semiconductors) within inverter 10 to prevent any thermal damage to the inverter 10 and/or motor.

Figure 3:
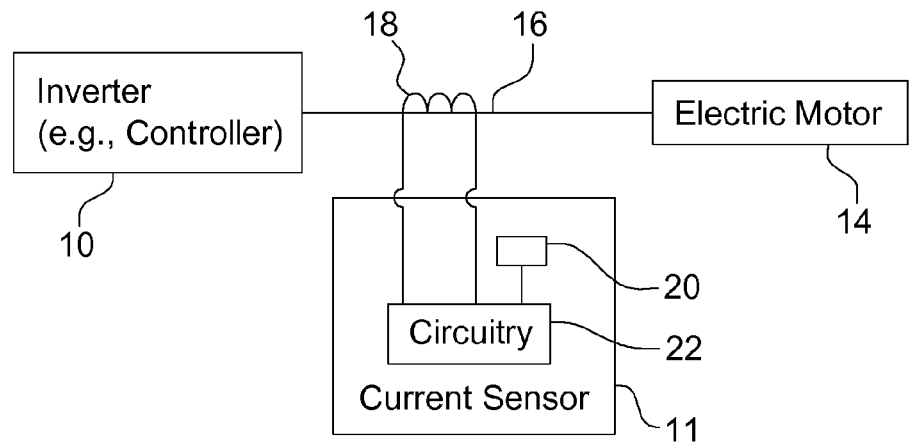
FIG. 3 is a block diagram that illustrates how the current sensor can be applied to measure the current associated with an input conductor to an electric motor.

As illustrated in FIG. 3, the inductor 18 and the magnetic field sensor 20 are arranged to be proximate or near a conductor 16 that connects an output terminal of an inverter 10 to an input terminal of an electric motor 14. For example, the inductor 18 and the multilayered substrate may have an opening such that the conductor 16 with the current to be observed is surrounded, partially or completely, by the inductor 18 to maximize or facilitate inductive coupling of current between the conductor 16 and the inductor 18. In one embodiment, the conductor 16 comprises a bus bar between an inverter 10 or motor controller and electric motor 14.

The current sensor of FIG. 1 or FIG. 2 may be applied to the detect current in a conductor 16 that supplies electrical energy (e.g., via one or more phases of alternating current signals) to an electric motor 14. A current change detector 24 determines a change in current versus time for the alternating signal component. A temperature estimator estimates a temperature of the conductor 16.

In one embodiment, the electric motor 14 requires only an alternating current input signal, such that if a direct current input signal is detected it may indicate that the inverter 10 is not functioning properly for one or more output phases.

Figure 4:
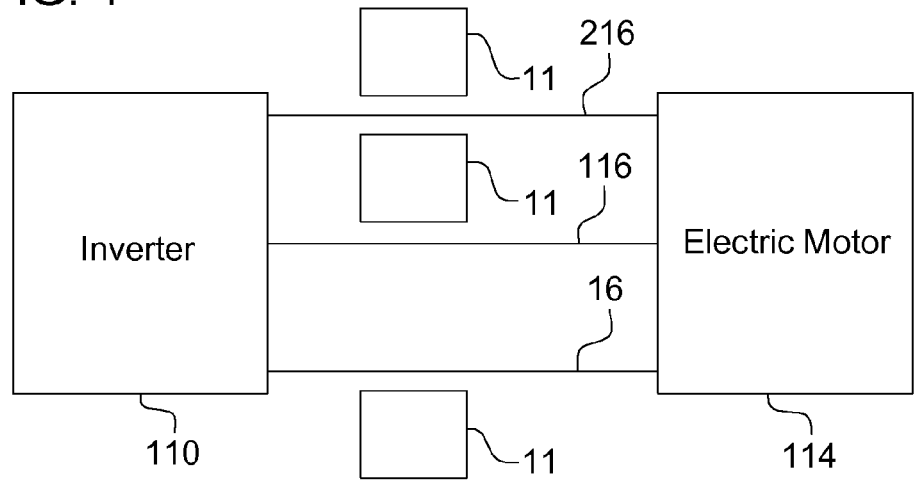
FIG. 4 is a block diagram that illustrates how multiple current sensors can be used to measure various electrical currents associated with a multiphase electric motor.

FIG. 4 is a block diagram that illustrates how multiple current sensors 11 can be used to measure various electrical currents associated with a multiphase electric motor 14. As illustrated, the electric motor 114 comprises a three-phase electric motor 14 that has three input phases. For example, each phase may have an alternating current input signal that is out of phase with the other input phases by a fixed amount (e.g., approximately 120 degrees of phase shift). A different current sensor 11 is associated with each of the phase inputs. Each of the phase inputs is associated with a corresponding conductor (16, 116, 216). FIG. 4 shows three conductors (16, 116, 216) between output terminals of the inverter 110 and input terminals of the electric motor 114. Each current sensor 11 may detect a different observed aggregate current and a change in current for each of the phases.

Figure 5:
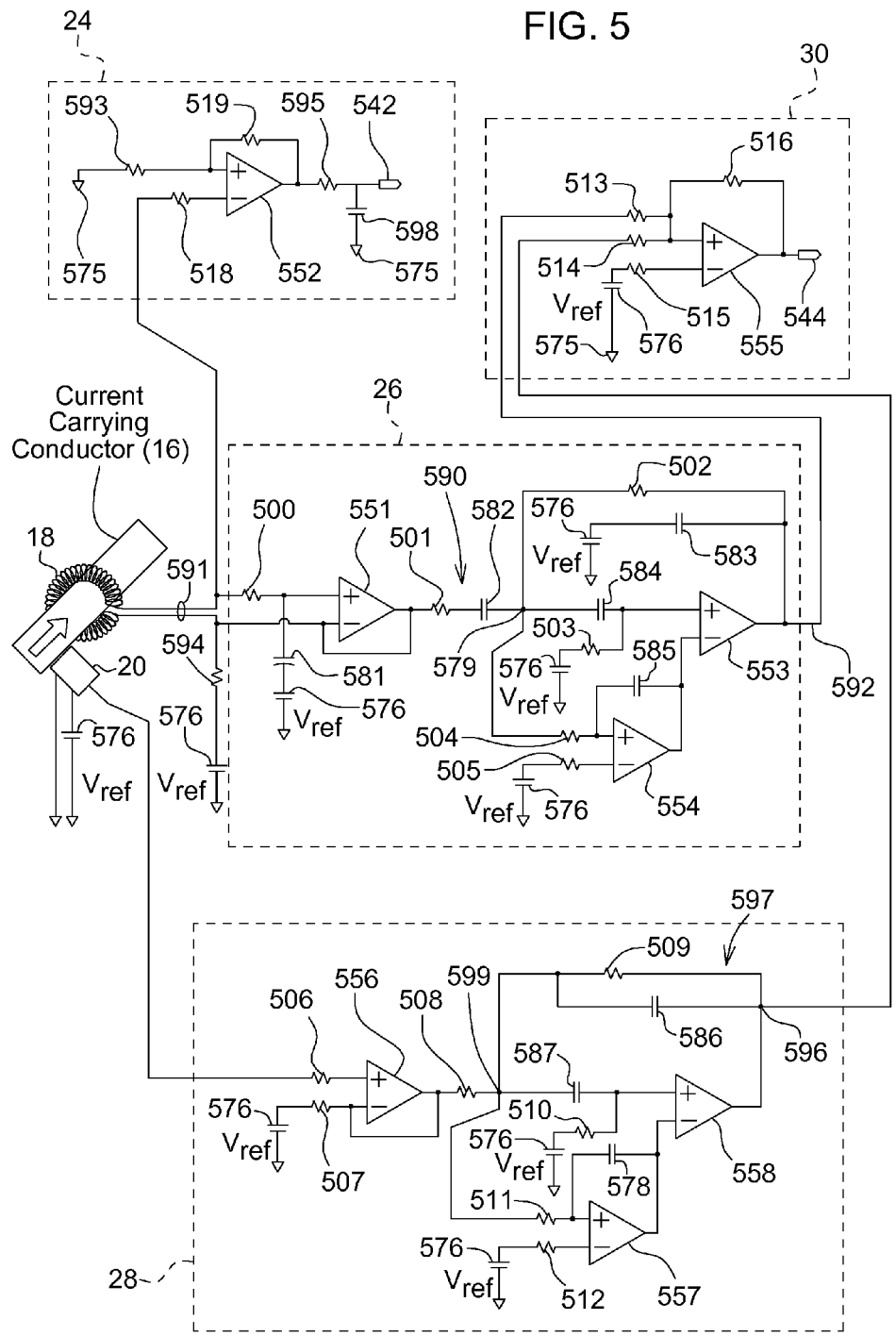
FIG. 5 shows illustrative circuits in greater detail consistent with the block diagram of FIG. 1.

FIG. 5 shows illustrative circuits in greater detail consistent with the block diagram of FIG. 1. Like reference numbers in FIG. 1, FIG. 2 and FIG. 5 indicate like elements.

A first filtering circuit 26 has a high-pass filter response. In one embodiment, the high-pass filter response is supported by the series combination 590 of a resistor 501 and a capacitor 582, where the capacitor 582 blocks or attenuates a direct current signal. The first filtering circuit 26 is coupled to the inductor 18 to receive an alternating current signal (e.g., first alternating current signal) at an input terminal 591 of the first filtering circuit 26 and to provide a filtered alternating current signal component (e.g., first alternating signal component) at an output terminal 592 of the first filtering circuit 26. The first filtering circuit 26 comprises a first amplifier 551, a second amplifier 554, and a third amplifier 553, and associated resistors and capacitors.

In one embodiment, the first amplifier 551 forms a unity gain follower circuit in which the unity gain follower buffers the alternating current signal from the inductor 18. Because the output of the first amplifier 551 is fed to the input (e.g., negative input terminal) of the first amplifier 551, the input voltage equals the output voltage for the first amplifier 551. One input terminal (e.g., positive input terminal) of the first amplifier 551 is connected to resistor 500 and capacitor 581. The capacitor 581 is fed by a positive terminal of reference voltage source 576. The negative input terminal of the first amplifier 551 is coupled to a positive terminal of reference voltage source 576 via resistor 594. In turn, the negative terminal of the reference voltage source 576 is connected to ground or common 575. The input terminals (e.g., two input terminals) of the first amplifier 551 are coupled to the terminals or taps of the inductor 18, where the positive input terminal of first amplifier 551 is coupled to the inductor 18 via series resistor 500.

The series combination 590 of resistor 501 and capacitor 582 are connected to the output of the amplifier 551 to support a high-pass filter response by attenuating or blocking a direct current signal from reaching other amplifiers (553, 554) within the first filtering circuit 26 at intermediate node 579.

The second amplifier 554 forms part of an integrating circuit that integrates or averages a value of an alternating current input signal at intermediate node 579. The capacitor 585 is selected based on the frequency of the alternating current input signal. One input terminal (e.g., positive input terminal) of the second amplifier 554 is connected to a resistor 504, whereas the other input terminal (e.g., negative input terminal) of the second amplifier 554 is connected to resistor 505 that is fed by a reference voltage source 576.

At one input terminal (e.g., positive input terminal), the third amplifier 553 receives an input signal via one or more of the following network elements to provide a high pass frequency response: (1) the series tuned circuit 590, (2) capacitor 582, or (3) capacitor 584. For example, the third amplifier 553 may amplify the signal in a pass-band frequency range that is proportional to a ratio of the resistance of resistor 502 to that of resistor 501. The input terminal (e.g., positive input terminal) of the amplifier 553 is connected to series combination of resistor 503 and voltage reference source 576. Similarly, an output terminal of the third amplifier 553 is connected to a series combination of capacitor 583 and a voltage reference source 576.

In one configuration, the third amplifier 553 can functions as a comparator that compares the inputs from the first amplifier 551 and the second amplifier 554 and generates or outputs a filtered first signal to indicate when the first input at intermediate node 579 differs from the second input (e.g. at the negative input terminal of amplifier 553).

A second filtering circuit 28 has a low-pass filter response. The second filtering circuit 28 coupled to the magnetic field sensor 20 to provide: (1) a filtered direct current signal component, (2) a lower frequency alternating signal component (e.g., second alternating signal component), or both. The second filtering circuit 28 comprises a first amplifier 556, a second amplifier 557, and a third amplifier 558, and associated resistors and capacitors. In one embodiment, the first amplifier 556 forms a unity gain follower circuit in which the unity gain follower buffers the signal from the magnetic field sensor 20. Because the output of the first amplifier 556 is fed back to the input (e.g., negative input) of the first amplifier 556, the input voltage equals the output voltage for the first amplifier 556. One input (e.g., positive input) of the first amplifier 556 is connected to resistor 506, whereas the other input (e.g., negative input) of the first amplifier 556 is connected to the series combination of resistor 507 and voltage reference source 576.

The second amplifier 557 forms part of an integrating circuit that integrates or averages a value of an alternating current input signal at central node 599. The capacitor 578 is selected based on the frequency of the alternating current input signal at node 599 or of the low frequency alternating signal component from the magnetic field sensor 20.

The third amplifier 558 works in conjunction with the feedback from the parallel tuned circuit 597 to provide a low pass response. As illustrated the parallel tuned circuit 597 is in the feedback path between the input (e.g., positive input terminal) and output terminal 596 of the third amplifier 558. The tuned circuit 597, alone or in combination with the third amplifier 558, can pass direct current signals, lower alternating current frequencies, or both to the output terminal 596 of the second filtering circuit 28 and the input of the sensor fusion circuit 30. For example, the third amplifier 558 may amplify the signal in a pass-band frequency range that is proportional to a ratio of resistor 509 to the resistor 508, near the central node 599. In one embodiment, the low-pass filter response is provided by a tuned circuit 597 formed of a parallel combination of capacitor 586 and resistor 509.

One input terminal (e.g., positive input terminal) of the third amplifier 558 is connected to a capacitor 587 and a series combination of resistor 510 and voltage reference source 576. The other input terminal (e.g., negative input terminal) of the third amplifier 558 is fed by the output of the second amplifier 557.

In one configuration, the third amplifier 558 can function as a comparator that compares the inputs from the first amplifier 556 and the second amplifier 557 and generates or outputs a filtered first signal to indicate when the first input differs from the second input.

In one embodiment, a sensor fusion circuit 30 determines an aggregate sensed current based on: (1) the filtered alternating current signal component and the filtered direct current signal component, or (2) the first filtered signal component and the second filtered signal component, where the first filtered signal component comprises a first filtered alternating current signal component and where the second filtered signal component comprises a direct current signal component and lower frequency alternating current signal component that is lower in frequency that the first filtered alternating current signal component. The aggregate sensed current refers to the combined current that includes contributions of the direct current signal components and alternating signal components. The sensor fusion circuit 30 comprises an operational amplifier 555 in a summing amplifier arrangement in which the inputs at a first resistor 513 and second resistor 514 are summed to produce an output voltage that is proportional to the sum of the input voltages at one input terminal (e.g., positive input terminal) of the amplifier 555. A reference voltage source 576 is applied to the other input terminal (e.g., negative input) of the operational amplifier 555 via a resistor 515, where a change in the reference voltage (e.g., variable reference voltage) can be used to scale or adjust the output of the sensed current. The sensor fusion output terminal 544 provides a current indicator of aggregate current flowing within the conductor 16, for example.

The current change sensor 24 comprises an amplifier 552 with a first input terminal (e.g., negative input terminal) coupled to inductor 18 via resistor 518 and a second input terminal (e.g., positive input terminal) coupled to ground (or a reference voltage source) via resistor 593. The feedback resistor 519 is connected between the input terminal (e.g., positive input terminal) and output terminal of the amplifier 552. The current change sensor output terminal 542 provides a current indicator of the change versus time of current flowing in the conductor 16. In one embodiment, an output resistor 595 is connected in series between the output of terminal of the amplifier 552 and the current change sensor output terminal 542, where a capacitor 598 is connected between the current change sensor output terminal 542 and ground 575.

Figure 6:
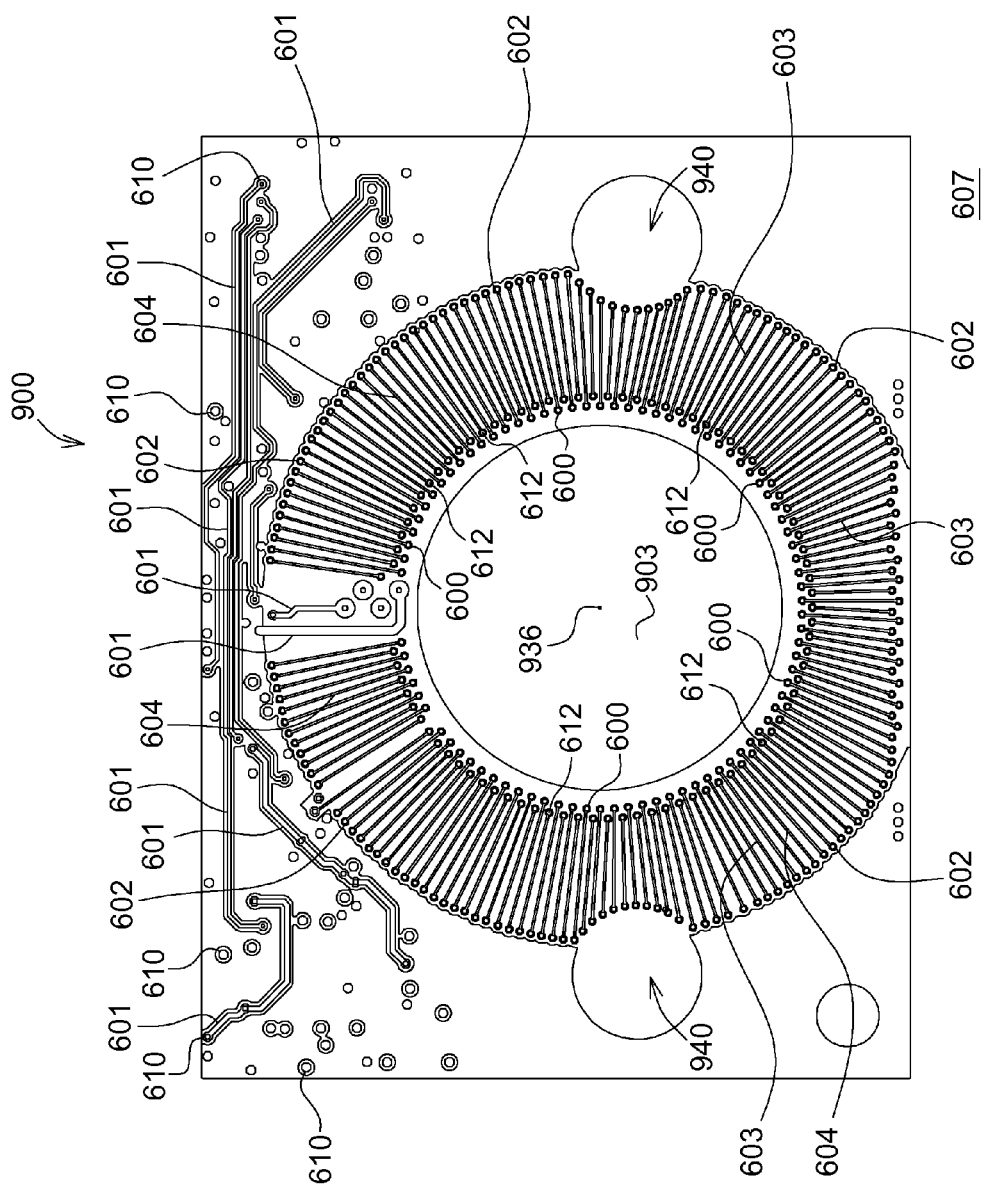
FIG. 6 shows a plan view of first layer of conductive traces, associated with an inductor, with an outer layer of a multi-layered substrate removed to better show the first layer, where the first layer is associated with a first internal layer of the substrate.

FIG. 6 shows a plan view of first layer of first conductive traces (603, 604), associated with an inductor 18, with an outer layer of a multi-layered substrate 900 removed to better show the first layer 607, where the first layer is associated with a first internal layer 607 of the multi-layered substrate 900 (e.g., multi-layered circuit board).

In one embodiment, the first layer of first conductive traces (603, 604) comprises buried conductive traces. The first conductive traces (603, 604) are generally linear segments that are radially extending with respect to a central axis 936. As illustrated, a set or some first conductive traces (e.g., 604) are longer than other first conductive traces (e.g., 603) of the first layer. However, the first conductive traces (603, 604) may be of the same length in alternate embodiments.

Each first conductive trace (603, 604) may terminate in an electrical and mechanical connection to an inner buried via (600, 612), or an outer buried via 602 to facilitate the formation of inductor with another layer (e.g., besides layer 607) of the multilayered substrate 900.

Although first the conductive traces (603, 604) occupy a generally annular area on the substrate or circuit board, the first conductive traces (603, 604) may deviate from a completely annular area with one or more notches 940, for example. The central axis 936 and a region inward from the generally annular area is associated with an opening 903 for inserting or positioning the conductor 16 to be observed or measured, with respect to its electrical current.

Besides the first conductive traces (603, 604), the first layer may comprise first supplemental conductive traces 601 and supplemental conductive vias 610 for interconnecting one or more components on the substrate. In one configuration, the first supplemental first traces 601 and the supplemental conductive vias are buried in the multi-layered substrate 900.

Figure 7:
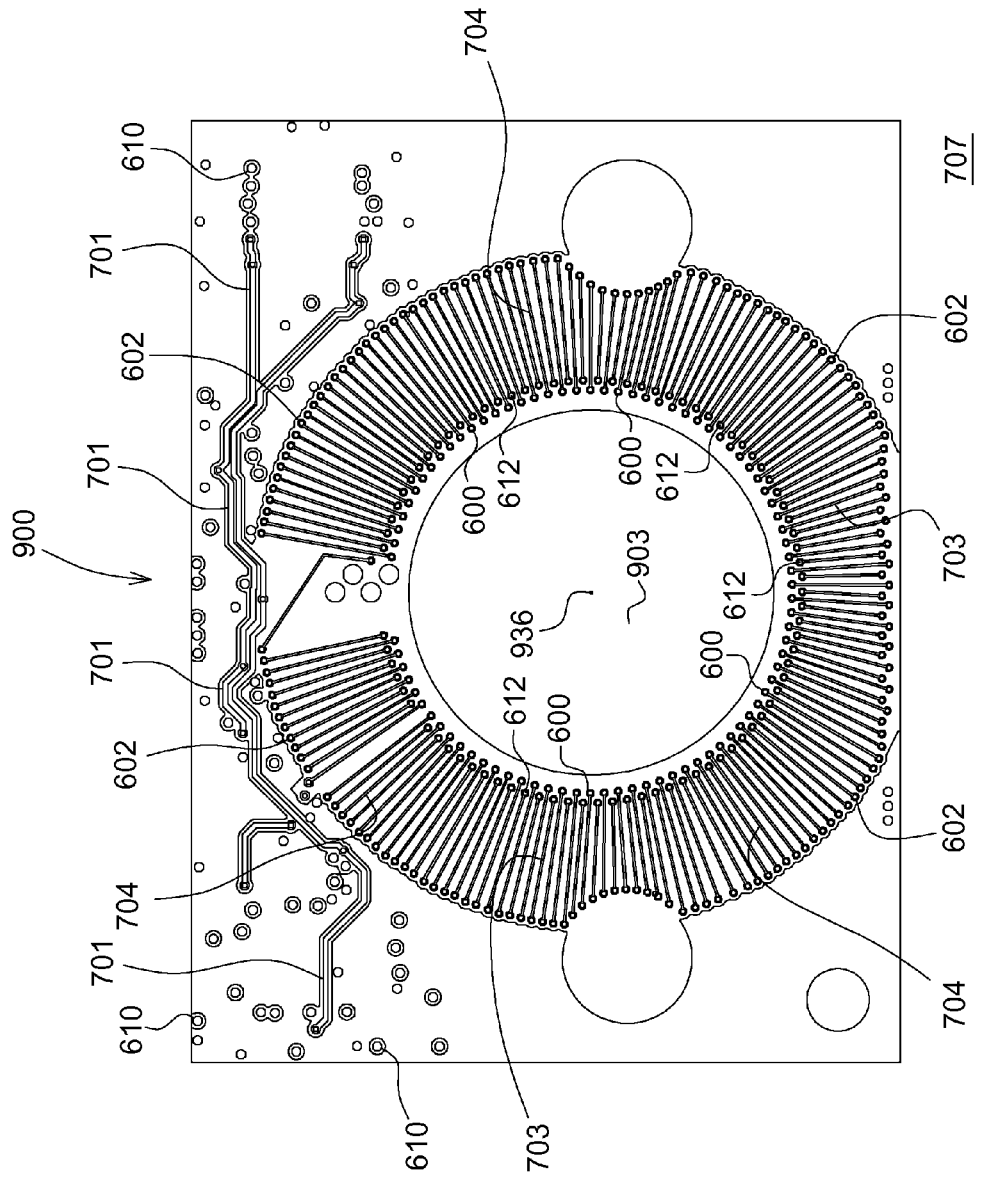
FIG. 7 shows a plan view of a second layer of conductive traces, associated with the inductor, with an outer layer of the substrate removed to better show the second layer, where the second layer is associated with a second internal layer and is on internal opposite side of the substrate from the first layer.

FIG. 7 shows a plan view of a second layer of second conductive traces (703, 704), associated with the inductor 18, with an outer layer of the substrate removed to better show the second layer, where the second layer is associated with a second internal layer (707) and is on internal opposite side of the substrate from the first internal layer 607 of the multi-layered substrate 900 (e.g., multi-layered circuit board).

In one embodiment, the first layer of second conductive traces (703, 704) comprises buried conductive traces. The second conductive traces (703, 704) are generally linear segments that are radially extending with respect to a central axis 936. As illustrated, a set or some second conductive traces (e.g., 704) are longer than other second conductive traces (e.g., 704) of the first layer. However, the second conductive traces (703, 704) may be of the same length in alternate embodiments.

Each second conductive trace (703, 704) may terminate in an electrical and mechanical connection to an inner buried via (600, 612), or an outer buried via 602 to facilitate the formation of inductor with another internal layer (e.g., internal layer 607 of FIG. 6) of the multilayered substrate 900.

Although the second conductive traces (703, 704) occupy a generally annular area on the substrate or circuit board, the second conductive traces (703, 704) may deviate from a completely annular area with one or more notches 940, for example. The central axis 936 and a region inward from the generally annular area is associated with an opening 903 for inserting or positioning the conductor 16 to be observed or measured, with respect to its electrical current.

Besides the second conductive traces (703, 704), the first layer may comprise second supplemental conductive traces 701 and supplemental conductive vias 610 for interconnecting one or more components on the substrate. In one configuration, the second supplemental conductive traces 701 and the supplemental conductive vias 610 are buried in the multi-layered substrate 900.

In one embodiment, the first conductive traces (603, 604) of FIG. 6 and second conductive traces (703, 704) of FIG. 7 are arranged in a series of layers that are spaced apart from each other by intervening dielectric portions of a substrate 900. The conductive traces (e.g., first and second conductive traces 603, 604, 703, 704) and conductive vias (600, 602, 612) (e.g., buried vias) form an inductor 18 with at least two taps or terminals, where the conductive traces of each layer of the layers are confined to a generally annular region on the substrate 900.

Figure 8:
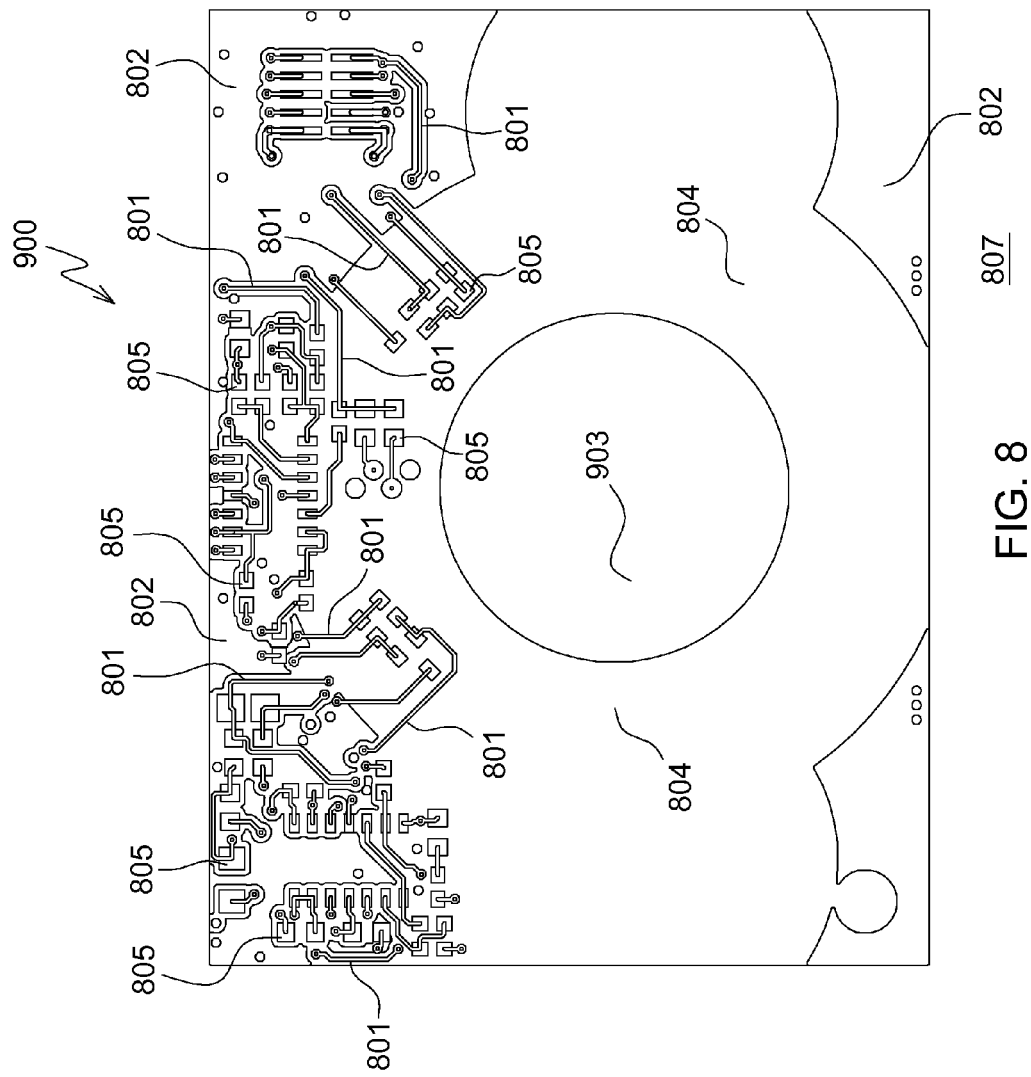
FIG. 8 shows a plan view of a first outer layer of the substrate.
Figure 9:
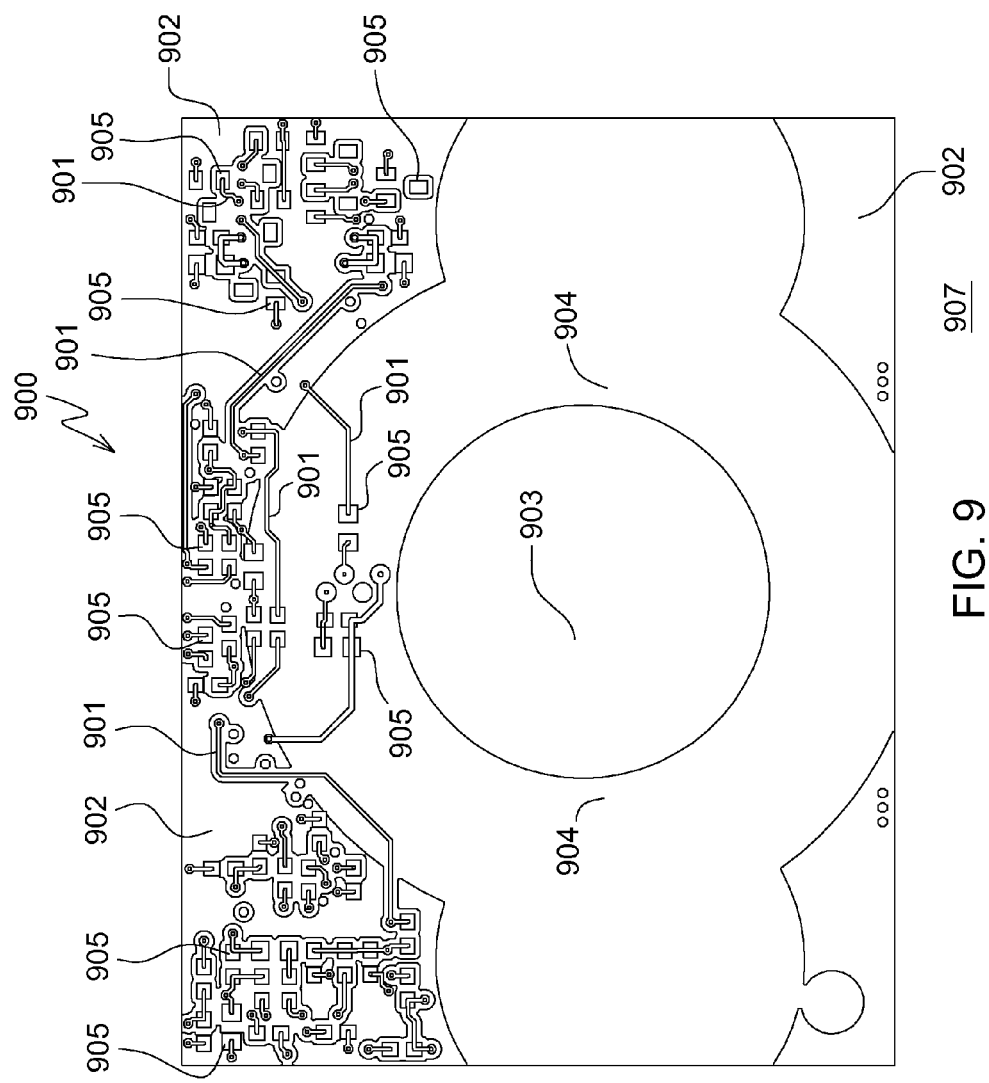
FIG. 9 shows a plan view a second outer layer of the substrate on an external opposite side of the substrate from the first outer layer.

FIG. 8 shows a plan view of a first outer layer 807 of the substrate 900. FIG. 9 shows a plan view a second outer layer 907 of the substrate on an external opposite side of the substrate 900 from the first outer layer 807. Like reference numbers in FIG. 6 through FIG. 9, inclusive, indicate like elements.

The first filtering circuit 26, the second filtering circuit 28 and the sensor fusion circuit 30 are formed by mounting electronic components on one or more sides of the substrate 900 or multi-layered circuit board in a region outward from an annular region 804 or annular volume of the inductor 18. For example, the first filtering circuit 26, the second filtering circuit 28 and the sensor fusion circuit 30 may be mounted on the first outer layer 807 of the substrate 900, the second outer layer 907 of the substrate 900, or both. The first filtering circuit 26, the second filtering circuit 28 and the sensor fusion circuit 30 each comprise one or more operational amplifiers, capacitors, resistors, or any other components 805 (e.g., electrical, semiconductor, or electronic components) that are interconnected via secondary circuit traces 801 on the substrate. The first outer layer 807 may have a conductive ground plane 802. The resistors and capacitors may be used in conjunction with the operational amplifiers to form active filters with desired frequency responses, for example.

FIG. 9 shows a plan view of a second outer layer 907 of the substrate 900. FIG. 9 shows a plan view a second outer layer 907 of the substrate on an external opposite side of the substrate 900 from the first outer layer 807. Like reference numbers in FIG. 6 through FIG. 9, inclusive, indicate like elements.

The first filtering circuit 26, the second filtering circuit 28 and the sensor fusion circuit 30 are formed by mounting electronic components on one or more sides of the substrate 900 or multi-layered circuit board in a region outward from an annular region 904 or annular volume of the inductor 18. For example, the first filtering circuit 26, the second filtering circuit 28 and the sensor fusion circuit 30 may be mounted on the first outer layer 807 of the substrate 900, the second outer layer 907 of the substrate 900, or both. The first filtering circuit 26, the second filtering circuit 28 and the sensor fusion circuit 30 each comprise one or more operational amplifiers, capacitors, resistors, or any other components 905 (e.g., electrical, semiconductor, or electronic components) that are interconnected via secondary circuit traces 901 on the substrate. The second outer layer 907 may have a conductive ground plane 902. The resistors and capacitors may be used in conjunction with the operational amplifiers to form active filters with desired frequency responses, for example.

Figure 10:
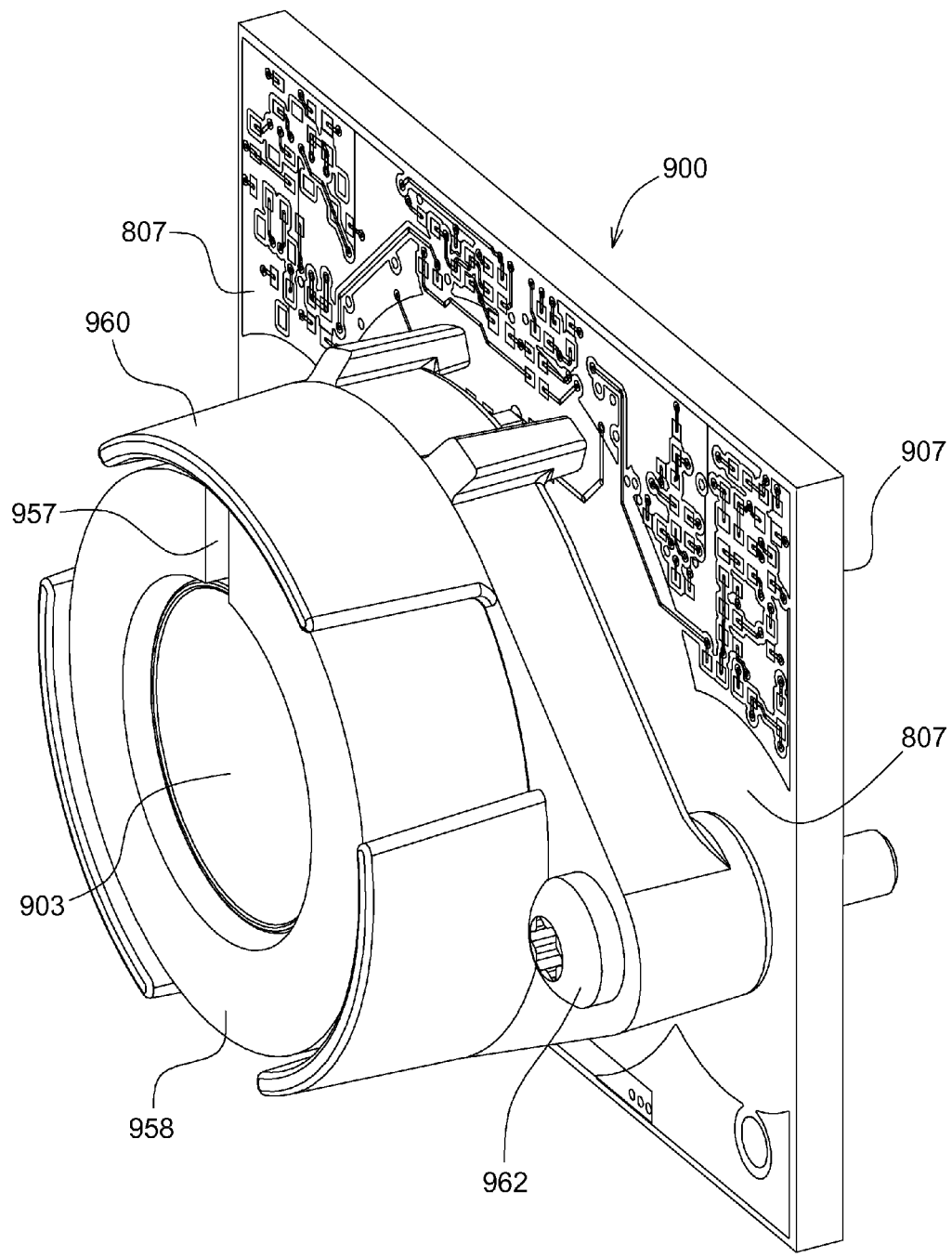
FIG. 10 shows a ferrite structure (e.g., toroidal core) for mounting around the conductor.

FIG. 10 shows a ferrite structure 958 (e.g., toroidal core) for mounting around the conductor 16 (e.g., 16) in which the current is to be measured. Like reference numbers in FIG. 6 through FIG. 10 indicate like elements.

The ferrite structure 958 is secured or held to the first outer layer 807 of the substrate 900 by a retainer 960 or core holder. In one embodiment, the retainer 960 has an annular recess for receipt of the ferrite structure 958 or toroidal ferrite core. The retainer 960 may be fastened to the substrate 900 via one or more fasteners 962.

The current sensor (e.g., 11 or 111) of FIG. 6 through FIG. 10, inclusive, comprises an inductor 18 formed of conductive traces (603, 604, 703, 704) and conductive vias (600, 602, 612) of a substrate 900 (e.g., multi-layered printed circuit board). For example, the inductor 18 may comprise a Time Varying Flux Sensor (TVFS) coil pattern using buried vias and traces in a multi-layered printed circuit board (PCB). Buried vias (600, 602, 612) and buried traces (603, 604, 703, 704) allow the inductor 18 to encircle and stay in close vicinity or proximity of current carrying conductor 16 (high voltage circuit) without compromising reinforced (double) insulation between high voltage and low voltage electronics. In practice, the current sensor 11 or 111 and its inductor 18 operate a lower voltage level, whereas the current carrying conductor 16 operates a higher voltage level than the lower voltage level.

Because the inductor 18 measures only time-varying current or flux such as an alternating current (AC) signal, for direct current measurement a magnetic field sensor 20 (e.g., a programmable Hall sensor) is used. To raise the sensitivity of the magnetic field sensor 20 (e.g., Hall sensor), the ferrite structure 958 or low-loss, gapped toroidal ferrite core is deployed sufficiently spaced apart from the inductor 18 TVFS coil. The gap 957 in the ferrite structure is a slot or break in the general annular shape or toroidal shape of the ferrite structure 958. The ferrite structure 958 offers desired performance under extreme operating conditions exhibited by high frequency (e.g., greater than approximately 500 Hz) fundamental alternating current (AC) current of high magnitude (e.g., greater than approximately 500 Amps, root mean squared (rms)). In one embodiment, the magnetic field sensor 20 is positioned in air gap 957 made in the ferrite structure 958.

A second filtering circuit 28 processes signal sensed by the magnetic field sensor 20 (e.g., Hall sensor or Hall probe). The sensor fusion circuit 30 combines signals from inductor 18 and magnetic field sensor 20 after the signals are processed by the first filtering circuit 26 and the second filtering circuit 28, respectively. The sensor fusion circuit 30 offers desired frequency response over a target frequency range (e.g., from direct current (DC) to high frequency (e.g., approximately 1000 Hz or greater) fundamental alternating current (AC) without any loss of gain and occurrence of phase shift between input and output signals.

The current sensor (11 or 111) comprises low voltage electronics mounted on a substrate 900 (e.g., circuit board). The low voltage electronics comprise one or more of the following circuits: (a) a first filtering circuit 26 (e.g., high pass filter), (b) a second filtering circuit 28 (e.g., low pass filter), (c) a sensor fusion circuit 30 (e.g., combiner), (d) current change detector 24, and (e) a temperature sensor 52. In one embodiment, the temperature sensor 52 is mounted very close to (e.g., few millimeter) high current connection made between inverter power modules (e.g., that use insulated gate bipolar transistors (IGBT's), metal oxide semiconductor field effect transistors (MOSFET's), or other power semiconductors) and an external load (e.g., an electric motor 14) coupled to the inverter 10.

The inductor 18 on the substrate allows enough remaining space for low voltage electronics (e.g., circuits 26, 28, 30, 24, and 52) to be packaged on outer layers (807, 907) of multi-layered substrate 900 to result in a smaller or compact footprint for current sensor (11 or 111). Further, there is sufficient mounting space on the substrate 900 to include a built-in temperature sensor 52 and a current change detector 24.

Figure 11:
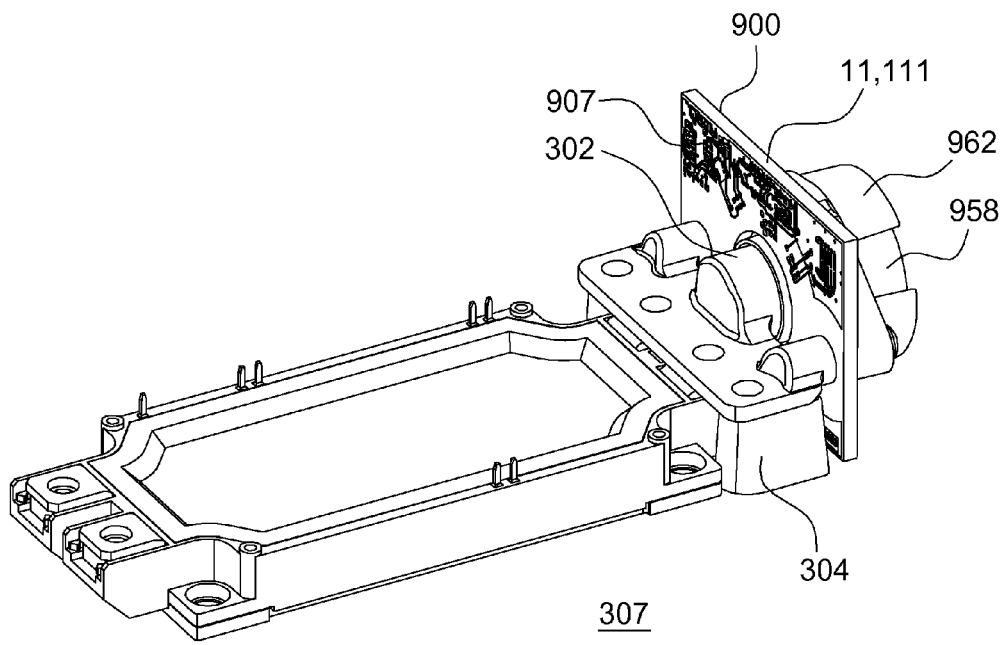

FIG. 11 shows the substrate 900 of the current sensor 11 or 111 mounted on an electronic assembly 307, such as an inverter 10 or a controller. Like reference numbers in FIG. 1 through FIG. 12, inclusive, indicate like elements.

Figure 12:
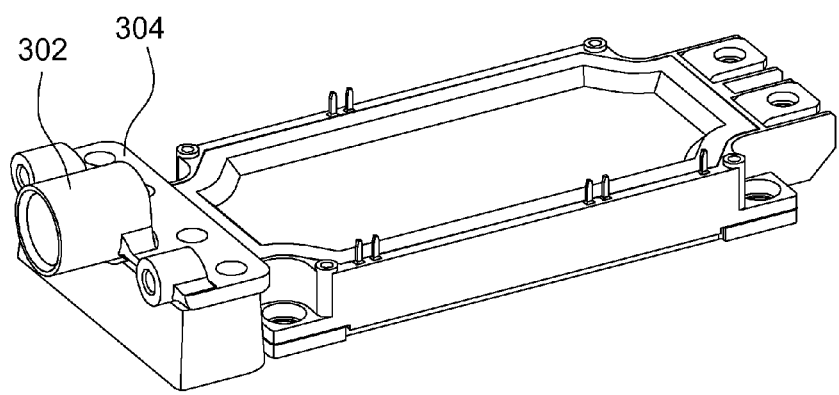

In FIG. 11 and FIG. 12, the current sensor (e.g., 11 or 111) or its associated electromechanical assembly has a high power connector 302 or socket for receiving the conductor 16. In FIG. 11, the substrate 900 of the current sensor (11 or 111) is connected to or supported by the housing 304, whereas in FIG. 12, the substrate 900 is omitted to better illustrate the connector 302. The connector 302 may comprise a generally cylindrical socket, for example. In one embodiment, the housing 304 supports the substrate 900 in a generally perpendicular plane with respect to an axis of any conductor (16) that is inserted into or connected to the connector 302, although other mounting configurations of the substrate 900 can fall within the scope of appended claims.

In FIG. 13, illustrates the assembly 307 of FIG. 11 from a different perspective than FIG. 11. Further, FIG. 13 shows a perspective semi-exploded view of the assembly 307 where a mating portion 309 (e.g., plug) of the conductor 16 is shown as removed from the opening 903 in the ferrite structure 958 and the associated substrate 900. Like reference numbers in FIG. 1 through FIG. 13, inclusive, indicate like elements.

FIG. 14 is similar to FIG. 13, except the ferrite structure 950 is replaced with dual ferrite structure 1958 and the mating portion 309 engages the connector 302. Like references in FIG. 1 through FIG. 14, inclusive, indicate like elements. In FIG. 14, the mating portion 309 or plug of the conductor 16 is positioned in the connector 302. The conductor 16 mates with the high current connector socket of the current sensor (11 or 111). The dual ferrite structure 1958 comprises two ferrite members 315, where on is positioned on each side of the magnetic field sensor 20 (e.g., Hall Effect sensor). As shown, each one, of the two ferrite members 315 in FIG. 14, is generally rectangular or polyhedral, although other shapes of ferrite members may be used and fall within the scope of certain claims appended hereto. The magnetic field sensor 20 or its inductive probe may be bounded by a ferrite member 315 on one or more sides, along a common axis 314. The surface-mounted, dual ferrite structure 1958 works as a magnetic flux concentrator to direct magnetic flux to the magnetic field sensor 20 (e.g., Hall Effect sensor). The dual ferrite structure 1958 and arrangement of FIG. 14 can achieve similar performance as a gapped torodial ferrite core 903. Further, the dual ferrite structure 1958 eliminates the need of a retainer 960 (FIG. 10) or core holder.

In one configuration, the dual ferrite structure 1958 comprises a magnetic flux concentrator on either the first outer layer 807 or second outer layer 809 of substrate 900. The configuration of FIG. 14 uses the free volume or headroom over the power semiconductor of the inverter to make the current sensor (11 or 111) or its assembly as compact as possible. In some embodiments, only a few millimeters of clearance are needed from the closest surface of the power semiconductor package (e.g., IGBT) to inverter wall or inverter housing.

The current sensor (e.g., 11 or 11) is capable of having a compact footprint that is smaller than many commercially available current sensors. The current sensor is well-suited to outperform certain commercially available current sensing schemes over a wide frequency (e.g., 0 Hz to 1000 Hz and beyond), an expansive current range (e.g., 0 A to approximately 500 Amps root mean squared (rms)), and a great temperature range (e.g., approximately −40 degrees Celsius to approximately 125 degrees Celsius).

The current rating and operating range of frequency (e.g., approximately 0 Hz to 1000 Hz (approximately) and beyond) is easily scalable, particularly with scheme shown in FIG. 14. For example, the magnetic field sensor 20 (e.g., Hall Effect sensor) may feature programmable sensitivity (e.g., measured in milliVolt (mV)/Gauss). The inductor 18 (e.g., substrate-based inductor design) may encircle, partially surround, or entirely surround the conductor 16, typically without requiring any change in a diameter or size of the opening 903 in the substrate 900 for supporting the inductor 18. In one configuration, the diameter of socket 302 and plug 309 can be adapted for current rating beyond 500 Amps root mean squared (rms). The configurations in this disclosure are well-suited for supporting a wide operating range of output frequencies of the inverter and extensive range of measured currents flowing through the conductor 16. This current sensor (11 or 111) does not require any potting material such as resin, silicone, polymer, or polymeric matrix; therefore, it suited for ambient storage or operation in temperature of approximately −55 degrees Celsius and below.

In one embodiment, the high current connector sensor (11 or 111) exhibits built-in thermal management when connector 302 or socket is placed and bolted down to power module terminals because heat loss at the connector 302 is thermally conducted to the housing 304 or its heat sink associated with the inverter (10). The high current connector 302 or socket makes connection to using a mating portion 309, such as a high current pin inserted into socket. For low resistance (e.g., less than 50 micro ohms or lower) connection, connector 302 or socket could deploy multi-lams to make tight contact with the mating portion 309 or pin while allowing a prodigious number of paths for current that flows between the connector 302 and the mating portion 309. The mating portion 309 or pin is depicted in FIG. 13 and FIG. 14; non-mating end of the mating portion 309 or pin is crimped with conductor 16, such as a high current cable to feeds power to load that could be away from inverter 10. As illustrated in certain figures, such as FIG. 14, the connector plug 309 and socket 302 form the portion of the conductor 16 where proposed current sensing scheme resides in inverter 10 assembly.

Various alternative embodiments or variations of the above embodiments may fall within the scope of the appended claims. In one example, the ferrite structure 958 or toroidal core for use with magnetic field sensor 20 (e.g., Hall element) as flux concentrator can be deleted for increased sensitivity and noise immunity for stray magnetic field. The deleted toroidal core is replaced by metal shielding to shield against magnetic or electromagnetic fields. For example, the metal shielding may comprise a metal screen or one or more metal walls for mounting around a periphery of the magnetic field sensor 20 on the substrate to project perpendicularly from an outer surface of the substrate.

In an alternate embodiment, windings of the inductor 18 could be wound partially or entirely on a gapped toroidal core, rather than being formed of the conductive traces and buried vias of the substrate. However, winding the inductor 18 on the toroidal core could increase cost of the assembly and raises the possibility of safety issues associated with insulation between high voltage electronics and low voltage electronics.

In another alternate embodiment, the filtering circuits could be replaced with digital or advanced filtering techniques, where the filtering circuits are housed in field programmable gate array (e.g., FPGA), digital signal processor (e.g., DSP) or a microprocessor. This will increase dependency of firmware needed to implement currents sensing scheme.

Figure 15:
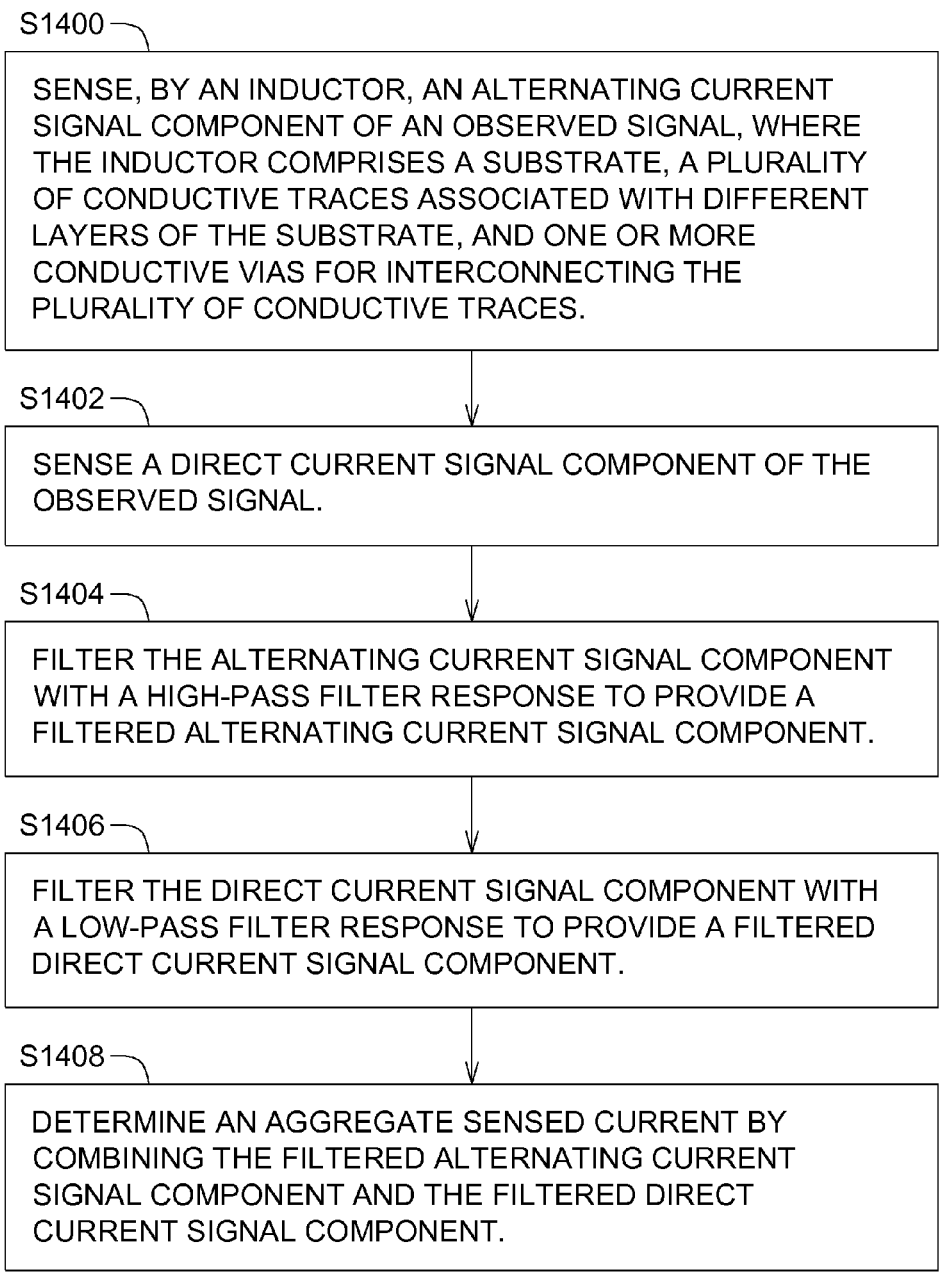
FIG. 15 is flow chart of one example of a method for sensing current in a conductor.

FIG. 15 illustrates a flow chart for one embodiment of a method for sensing current. The method of FIG. 15 begins in step S1400.

In step S1400, an inductor 18 senses an alternating current signal component of an observed signal. Step S1400 may be carried out in accordance with various techniques, which may be applied alternately or cumulatively.

Under a first technique, the inductor 18 comprises a substrate, a plurality of conductive traces (e.g., buried conductive traces) associated with different layers of the substrate, and one or more conductive vias (e.g., buried vias) for interconnecting the plurality of conductive traces.

Under a second technique, the inductor 18 is arranged, oriented or positioned to be proximate or near a conductor that connects an inverter output of an inverter to an electric motor. For example, the conductor may intercept an opening 903 in the substrate 900 or a central region or volume of the inductor 18.

Under a third technique, the inductor 18 is formed by arranging the conductive traces in the different layers that are spaced apart from each other by intervening dielectric portions of a substrate wherein the conductive traces are radially extending with respect to a central axis and are limited to occupy a generally annular area or volume of the substrate.

In step S1402, a magnetic field sensor 20 senses a direct current signal component of the observed signal. In one configuration, the magnetic field sensor (e.g., Hall Effect sensor), or its probe, is arranged, oriented or positioned to be proximate or near a conductor that connects an inverter output of an inverter to an electric motor.

In step S1404, a first filtering circuit 26 filters the alternating current signal component with a high-pass filter response to provide a filtered alternating current signal component. In one configuration, the first filtering circuit 26 is assembled or made by mounting electronic components on one or more sides of the substrate in a region outward from an annular region or annular volume of the inductor to form at least one of a first filtering circuit, a second filtering circuit and a sensor fusion circuit on the substrate.

In step S1406, a second filtering circuit 28 filters the direct current signal component with a low pass filter response to provide a filtered direct current signal component. In one configuration, the second filtering circuit 28 is assembled or made by mounting electronic components on one or more sides of the substrate in a region outward from an annular region or annular volume of the inductor to form at least one of a first filtering circuit, a second filtering circuit and a sensor fusion circuit on the substrate.

In step S1408, a sensor fusion circuit 30 determines an aggregate sensed current by combining the filtered alternating current signal component and the filtered direct current signal component. For example, the sensor fusion circuit 30 scales a first gain of the filtered alternating signal component and a second gain of the filtered direct current signal component to obtain a conversion factor between actual current of the observed signal flowing through the conductor and the aggregate sensed current. In one configuration, the sensor fusion circuit 30 is assembled or made by mounting electronic components on one or more sides of the substrate in a region outward from an annular region or annular volume of the inductor to form at least one of a first filtering circuit, a second filtering circuit and a sensor fusion circuit on the substrate.

Figure 16:
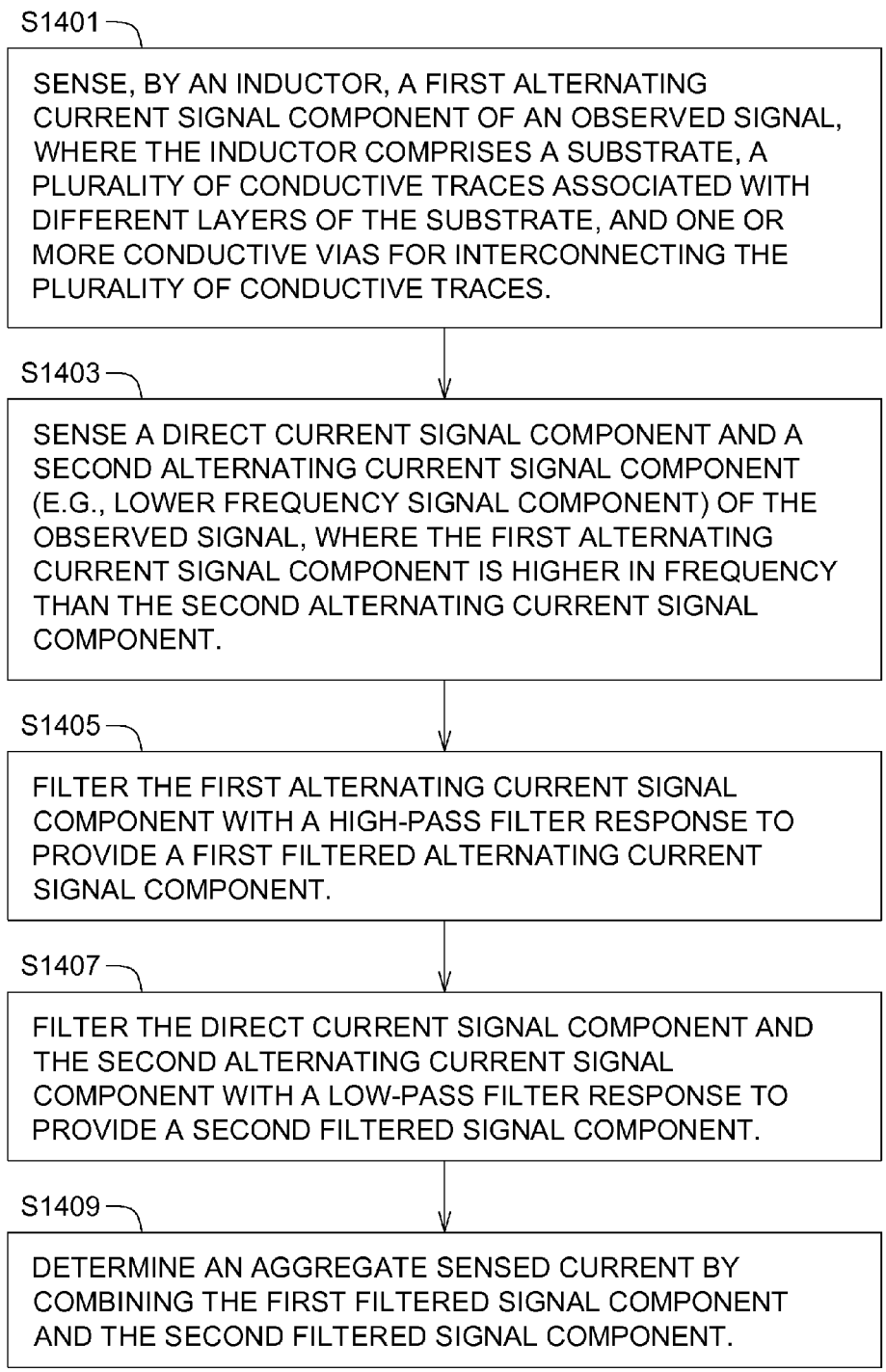
FIG. 16 is flow chart of another example of a method for sensing current in a conductor.

FIG. 16 illustrates a flow chart for one embodiment of a method for sensing current. The method of FIG. 16 begins in step S1401.

In step S1401, an inductor 18 senses a first alternating current signal component of an observed signal. In one embodiment, the inductor 18 comprises a substrate, a plurality of conductive traces associated with different layers of the substrate, and one or more conductive vias for interconnecting the plurality of conductive traces.

In step S1403, a magnetic field sensor 20 senses a direct current signal component and a second alternating signal component (e.g., a lower frequency signal component) of the observed signal, where the first alternating signal component is higher in frequency than the second alternating signal component.

In step S1405, a first filtering circuit 26 filters the first alternating current signal component with a high-pass filter response to provide a first filtered signal component.

In step S1407, a second filtering circuit 28 filters the direct current signal component and the second alternating current signal component with a low pass filter response to provide a second filtered signal component.

In step S1409, a sensor fusion circuit 30 determines an aggregate sensed current by combining the first filtered signal component and the second filtered signal component.

In alternate embodiments of the above methods, additional steps may be added to the method of FIG. 15 or FIG. 16, such as determining a change in current versus time for the alternating signal component or estimating a temperature of a conductor for carrying the observed signal.

Having described the preferred embodiment, it will become apparent that various modifications can be made without departing from the scope of the invention as defined in the accompanying claims. For example, one or more of any dependent claims set forth in this document may be combined with any independent claim to form any combination of features set forth in the appended claims, and such combination of features in the claims are hereby incorporated by reference into the specification of this document.

The following is claimed:

1. A current sensor comprising:
   an inductor for sensing an alternating current signal component of an observed signal, the inductor comprising a multi-layered substrate, a plurality of conductive traces associated with different layers of the substrate, and one or more conductive vias for interconnecting the plurality of conductive traces;
   a magnetic field sensor for sensing a direct current signal component of the observed signal;
   a first filtering circuit having a high-pass filter response, the first filtering circuit coupled to the inductor to provide a filtered alternating current signal;
   a second filtering circuit having a low-pass filter response, the second filtering circuit coupled to the magnetic field sensor to provide a filtered direct current signal; and
   a sensor fusion circuit for accepting the filtered alternating current signal and the filtered direct current signal and for determining an aggregate sensed current.

2. The current sensor according to claim 1, further comprising:
   a current change detector for determining a change in current versus time for the alternating current signal component.

3. The current sensor according to claim 1, wherein the inductor and the magnetic field sensor are arranged to be proximate or near a conductor that connects an inverter output of an inverter to an electric motor.

4. The current sensor according to claim 3, wherein the conductor comprises a bus bar or one or more wire bonds associated with a power semiconductor within an inverter.

5. The current sensor according to claim 3, further comprising:
   a temperature sensor for estimating a temperature of the conductor.

6. The current sensor according to claim 1, wherein the sensor fusion circuit is adapted to scale a first gain of the filtered alternating current signal and a second gain of the filtered direct current signal to obtain a conversion factor between actual current of the observed signal flowing through a conductor and the aggregate sensed current.

7. The current sensor according to claim 1, wherein the substrate comprises a circuit board and wherein the conductive vias comprise buried vias.

8. The current sensor according to claim 1, wherein the conductive traces are radially extending with respect to a central axis, and wherein the conductive traces are arranged in the different layers that are spaced apart from each other by intervening dielectric portions of the substrate.

9. The current sensor according to claim 8, wherein the conductive traces form an inductor with at least two taps or terminals, where the conductive traces of each layer of the layers are confined to a generally annular region on the substrate.

10. The current sensor according to claim 1, wherein the magnetic field sensor comprises a programmable or pre-programmed Hall Effect sensor.

11. The current sensor according to claim 10, wherein the magnetic field sensor is associated with a ferrite structure to attenuate stray electromagnetic fields that might otherwise result in distortions in the measurement of the direct current signal component.

12. The current sensor according to claim 11, wherein the ferrite structure comprises a toroidal core with an air gap and wherein the magnetic field sensor or its probe is mounted in the air gap.

13. The current sensor according to claim 11, wherein the ferrite structure comprises a ferrite members that are placed on opposite sides of the magnetic field sensor or its probe, where the ferrite members are aligned about a common axis.

14. The current sensor according to claim 1, wherein the first filtering circuit, the second filtering circuit and the sensor fusion circuit are formed by mounting electronic components on one or more sides of the substrate in a region outward from an annular region or annular volume of the inductor.

15. The current sensor according to claim 1, wherein the first filtering circuit, the second filtering circuit and the sensor fusion circuit each comprise one or more operational amplifiers and resistors that are interconnected via secondary circuit traces on the substrate.

16. A method for sensing current, the method comprising:
   sensing, via an inductor, an alternating current signal component of an observed signal, the inductor comprising a substrate, a plurality of conductive traces associated with different layers of the substrate, and one or more conductive vias for interconnecting the plurality of conductive traces;
   sensing a direct current signal component of the observed signal;
   filtering the alternating current signal component with a high-pass filter response to provide a filtered alternating current signal;
   filtering the direct current signal component with a low pass filter response to provide a filtered direct current signal; and determining an aggregate sensed current by combining the filtered alternating current signal and the filtered direct current signal.

17. The method according to claim 16, further comprising: determining a change in current versus time for the alternating current signal component.

18. The method according to claim 16, further comprising: estimating a temperature of a conductor for carrying the observed signal.

19. The method according to claim 16, wherein arranging the inductor to be proximate or near a conductor that connects an inverter output of an inverter to an electric motor.

20. The method according to claim 19, further comprising: scaling a first gain of the filtered alternating current signal and a second gain of the filtered direct current signal to obtain a conversion factor between actual current of the observed signal flowing through the conductor and the aggregate sensed current.

21. The method according to claim 16, further comprising: arranging the conductive traces in the different layers that are spaced apart from each other by intervening dielectric portions of a substrate wherein the conductive traces are radially extending with respect to a central axis and are limited to occupy a generally annular area or volume of the substrate.

22. The method according to claim 16, further comprising: mounting electronic components on one or more sides of the substrate in a region outward from an annular region or annular volume of the inductor to form at least a first filtering circuit, a second filtering circuit and a sensor fusion circuit on the substrate.

* * * * *